United States Patent [19]
Van Leeuwen

[11] Patent Number: 5,994,958
[45] Date of Patent: Nov. 30, 1999

[54] AMPLIFIER ARRANGEMENT

[75] Inventor: Dirk Y. W. Van Leeuwen, Brugge, Belgium

[73] Assignee: U.S. Philips Corporation, New York, N.Y.

[21] Appl. No.: 09/026,449

[22] Filed: Feb. 19, 1998

[30] Foreign Application Priority Data

Feb. 27, 1997 [EP] European Pat. Off. ............. 97200579

[51] Int. Cl.⁶ .................................................. H03F 1/52
[52] U.S. Cl. ...................................... 330/207 P; 330/298
[58] Field of Search ............................. 330/207 P, 298, 330/289, 297, 284; 348/707

[56] References Cited

U.S. PATENT DOCUMENTS

| | | |
|---|---|---|
| 3,988,693 | 10/1976 | Seki ..................................... 330/207 P |
| 4,158,180 | 6/1979 | Challen .................................. 330/298 |
| 4,380,089 | 4/1983 | Weir ..................................... 330/207 P |
| 4,509,101 | 4/1985 | Kenji .................................... 330/207 P |
| 4,510,460 | 4/1985 | Tamura ................................... 330/297 |
| 5,473,282 | 12/1995 | Janssens et al. ........................ 330/289 |
| 5,495,214 | 2/1996 | Malota ................................... 330/265 |
| 5,497,125 | 3/1996 | Royds .................................... 330/298 |
| 5,847,610 | 12/1998 | Fujita ................................... 330/298 |

FOREIGN PATENT DOCUMENTS 2017437A 10/1979 United Kingdom ............ H03G 3/32

*Primary Examiner*—Robert Pascal
*Assistant Examiner*—Khanh Van Nguyen
*Attorney, Agent, or Firm*—Edward W. Goodman

[57] ABSTRACT

In a display signal amplifier arrangement, a current-sensing circuit (S) measures a supply current of an amplifier (A) to obtain a control signal (CTRL) for a bandwidth-reducing circuit (BRC) preceding the amplifier (A), where the bandwidth-reducing circuit (BRC) adaptively attenuates a high-frequency part of the display signal in dependence upon the supply current.

4 Claims, 2 Drawing Sheets

AMPLIFIER ARRANGEMENT

BACKGROUND OF THE INVENTION

1. Field of the Invention

The invention relates to a display signal amplifier arrangement and to a display apparatus comprising such an amplifier arrangement.

2. Description of the Related Art

U.S. Pat. No. 5,473,282 (attorneys' docket PHN 14,375) discloses an audio amplifier arrangement including a first signal processor stage for influencing the signal strength of a received audio signal for at least part of the frequency range of the received audio signal. An output amplifier stage amplifies the audio signal influenced by the first signal processor stage. The audio amplifier arrangement further includes a transformer having a primary winding which is connectable to line voltage and having a secondary winding which is connected to an AC/DC converter whose outputs are connected to at least the output amplifier stage for feeding the output amplifier stage. A detection circuit generates a detection signal which is related to the power load of the transformer. In response to the detection signal, an analysis circuit detects whether the rise in temperature occurring in the transformer due to the power load has exceeded a specific norm. The analysis circuit comprises a control circuit for reducing the signal strength of the received audio signal for at least said part of the frequency range in the case where a transgression of said norm is detected. When reducing the signal strength for a reduction of the power load, it will be sufficient to reduce the signal strengths of the signal components that represent the low tones in the audio signal. For that matter, the power necessary for reproducing these tones is large as compared with the power necessary for reproducing the higher tones. However, it is also possible, by reducing the sound volume, to reduce the signal strength of the audio signal throughout the audio spectrum instead of reducing the low-frequency components.

Such amplifier arrangements are not suitable for display signals, because the visibility of display signals is impaired if at least the low-frequency components are reduced.

SUMMARY OF THE INVENTION

It is, inter alia, an object of the invention to provide an amplifier arrangement suitable for a display signal. To this end, a first aspect of the invention provides an amplifier arrangement comprising an amplifier having a supply current terminal, a signal input and a signal output; a current-sensing circuit having a sensing input coupled to said supply current terminal of the amplifier, and a control output for supplying a control signal; and a bandwidth-reducing circuit for attenuating a high-frequency part of a display signal applied to said amplifier (A) and/or for decreasing a high-frequency part of a transfer function of said amplifier, in response to said control signal. A second aspect of the invention provides a display apparatus comprising such an amplifier arrangement. A third aspect of the invention provides a method of amplifying a display signal, the method comprising the steps of amplifying said display signal by means of an amplifier to which a supply current is applied; measuring said supply current to derive a control signal; and reducing a bandwidth of said display signal applied to a signal input of said amplifier, wherein a high-frequency part of said display signal is attenuated in response to said control signal. Alternatively, a fourth aspect of the invention provides a method of amplifying a display signal, the method comprising the steps of amplifying said display signal by means of an amplifier to which a supply current is applied; measuring said supply current to derive a control signal; and decreasing a high-frequency part of a transfer function of said amplifier in response to said control signal.

In a display signal amplifier arrangement in accordance with a preferred embodiment of the present invention, a current-sensing circuit measures a supply current of an amplifier to obtain a control signal for a bandwidth-reducing circuit located before (an output stage of) the amplifier, where the bandwidth-reducing circuit adaptively attenuates a high-frequency part of the display signal in dependence upon the supply current. As a result, the dissipation in the amplifier diminishes. Consequently, an amplifier arrangement in accordance with the present invention needs fewer cooling plates or even no heat sinks at all.

The invention is based on the recognition that dissipation is caused to a large extent by high-frequency components in the display signal. If the dissipation increases, a supply current applied to the amplifier increases. A measurement of this supply current thus results in a measure of the dissipation. If this measurement of the supply current indicates that the dissipation becomes too high, the high-frequency components in the display signal are reduced by the bandwidth-reducing circuit, thus removing the cause of the dissipation. As, in accordance with the present invention, the heat is eliminated by reducing its cause, it becomes possible to reduce the number of heat sinks so that, overall, a BEF 12 cheaper circuit is obtained, even though more electronic components are needed. These savings are quite considerable if multiplied by the total number of TV sets containing this circuit. An additional environmental advantage is that the overall power consumption diminishes. In a practical embodiment, the supply current of each of the three color amplifiers was limited to somewhat less than 7 mA by the measure in accordance with the invention, whereas without this measure, the current would have become as high as about 9 mA. The junction temperature was limited to about 140° C., whereas without the measure of the invention, temperatures of about 170° C. were obtained. This shows that the invention effectively reduces both the power consumption and the temperature of the amplifier arrangement. As a bonus, a kind of adaptive noise reduction is obtained.

These and other aspects of the invention will be apparent from and elucidated with reference to the embodiments described hereinafter.

DESCRIPTION OF THE PREFERRED EMBODIMENTS

Figure 1:
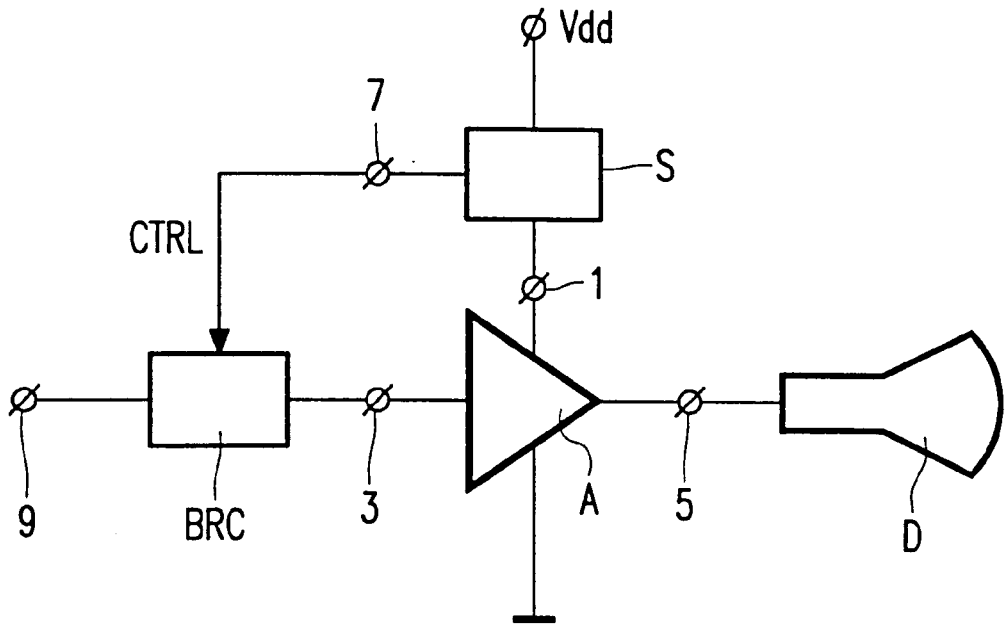
FIG. 1 shows a basic circuit diagram of a display apparatus in accordance with the present invention.

In the display apparatus of FIG. 1, a display signal is applied to an input 9 of an output amplifier arrangement of a display apparatus. The display signal is applied to an input 3 of an amplifier A thru a bandwidth-reducing circuit BRC. The amplified display signal is supplied at an output 5 which is connected to a display device D. A power supply terminal 1 of the amplifier A is connected to a power supply voltage Vdd thru a current-sensing circuit S. A control signal output 7 of the current-sensing circuit S supplies a control signal CTRL to a control input of the bandwidth-reducing circuit BRC.

Figure 2:
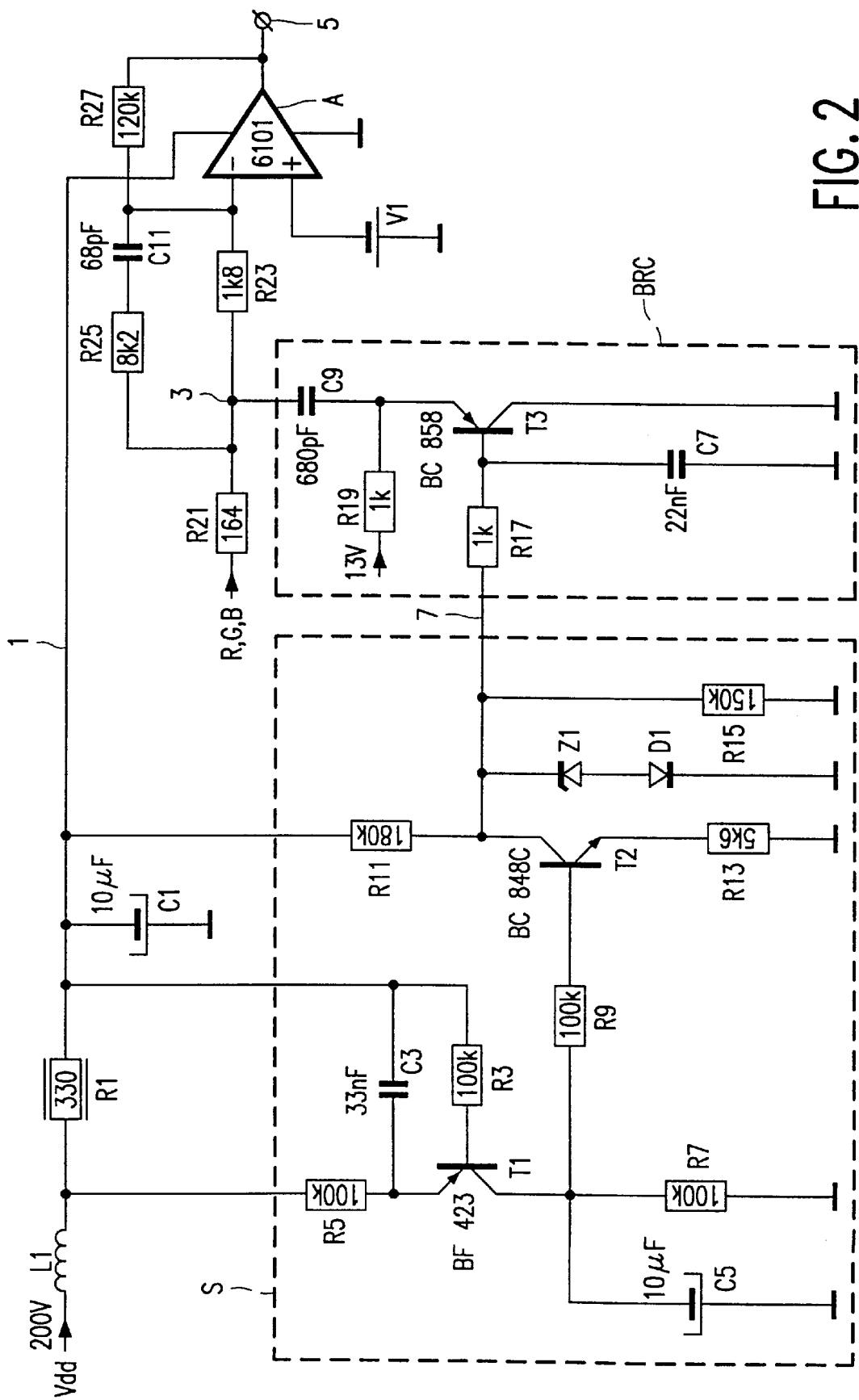
FIG. 2 shows a more elaborate implementation of a preferred embodiment of an amplifier arrangement in accordance with the present invention.

In FIG. 2, a 200 V supply voltage Vdd is applied to the supply current terminal 1 of the amplifier A thru a coil L1 and a security resistor R1. In FIG. 2, the numbers within the resistors indicate the resistance in Ohms. The supply current is measured by the current-sensing circuit S by measuring the voltage across the resistor R1. A smoothing capacitor C1 is connected between the supply current terminal 1 and ground. In FIG. 2, the capacitances of the capacitors are indicated next to the capacitors.

In the current-sensing circuit S, the supply current terminal 1 is connected to the base of a PNP transistor T1 thru a resistor R3. A capacitor C3 is connected between the supply current terminal 1 and an emitter of the transistor T1. A resistor R5 is connected between the emitter of the transistor T1 and the connection point of the coil L1 and the resistor R1. A parallel circuit of a capacitor C5 and a resistor R7 is connected between the collector of the transistor T1 and ground. The voltage drop across the resistor R1, which is caused by the supply current, is copied to the capacitor C5 in so far as this voltage drop exceeds the $V_{be}$ of the transistor T1. The voltage across the capacitor C5 is amplified and inverted by an NPN transistor T2 having a base connected to the capacitor C5 thru a base resistor R9, a collector connected to the supply current terminal 1 thru a resistor R11, and an emitter connected to ground thru a resistor R13. The collector of the transistor T2 is connected to ground thru a parallel connection of a resistor R15 and a series connection of a zener diode Z1 and a diode D1. The zener diode Z1 prevents the voltage at the base of the transistor T3 from becoming too high when a bandwidth reduction is not yet desired if the supply current of the amplifier A is not yet too high. The collector of the transistor T2 is connected to the control signal output 7 of the current-sensing circuit S.

In the bandwidth-reducing circuit BRC, a PNP transistor T3 has a base connected to the control signal output 7 of the current-sensing circuit S thru a resistor R17, and to ground thru a capacitor C7. A collector of the transistor T3 is connected to ground. An emitter of the transistor T3 is connected to a 13 V supply voltage thru a resistor R19, and to the input terminal 3 of the amplifier A thru a capacitor C9.

An R, G, or B display signal at the input terminal 9 is applied to the terminal 3 thru a resistor R21 which, together with the capacitor C9, constitutes an RC network which causes a bandwidth reduction when the transistor T3 becomes conducting, which happens if the voltage at the collector of the transistor T2 becomes low enough (lower than 12.6 V), which happens if the voltage across the capacitor C5 becomes high enough, which happens if the supply current thru the resistor R1 causes a sufficiently high voltage drop across the resistor R1. The –3 dB frequency caused by the capacitor C9 of 680 pF and the resistor R21 of 164 Ohms is about 1.4 MHz.

A non-inverting input of the amplifier A is connected to ground thru a voltage source V1. An inverting input of the amplifier A is connected to the terminal 3 thru a parallel connection of a resistor R23 and a series connection of a resistor R25 and a capacitor C11. A feedback resistor R27 is connected between the output and the inverting input of the amplifier A. The series connection of the resistor R25 and the capacitor C11 serves to compensate the undesired pole caused by the capacitor C9 and the resistor R19.

In a color display apparatus, there are three bandwidth-reducing circuits BRC and three amplifiers A, one for each color, while there is a shared current-sensing circuit S.

It should be noted that the above-mentioned embodiments illustrate rather than limit the invention, and that those skilled in the art will be able to design many alternative embodiments without departing from the scope of the appended claims. The invention can be implemented by means of hardware comprising several distinct elements, and by means of a suitably programmed computer. Instead of bipolar transistors, field effect transistors may be used. The amplifier may have several stages, in which a supply current of a first stage is measured to derive the control signal CTRL for controlling the bandwidth-reducing circuit which is then located in the signal path between the first stage and an output stage of the amplifier; in this case, the signal input 3 of the amplifier A recited in the claims is a signal input of the output stage of the amplifier A so that the bandwidth reduction takes place before the display signal reaches the output stage which causes most dissipation problems.

In a further alternative embodiment, a gain-determining element of the amplifier A is adaptively made frequency-dependent in response to the control signal CTRL from the current-sensing circuit S. For example, the feedback network of the amplifier A could contain a series connection of a capacitor and a transistor, in parallel with the feedback resistor R27, which capacitor is adaptively switched on by means of the transistor in response to the control signal CTRL indicating the supply current of the amplifier A. In this manner, the bandwidth of the amplifier A gradually decreases with an increasing supply current. This alternative is based on the same insight as the previous embodiments, viz. dissipation is largely caused by high frequencies, so that dissipation can be reduced by attenuating these high frequencies either in the input signal applied to the amplifier A or in the amplification stage itself.

Figure 3:
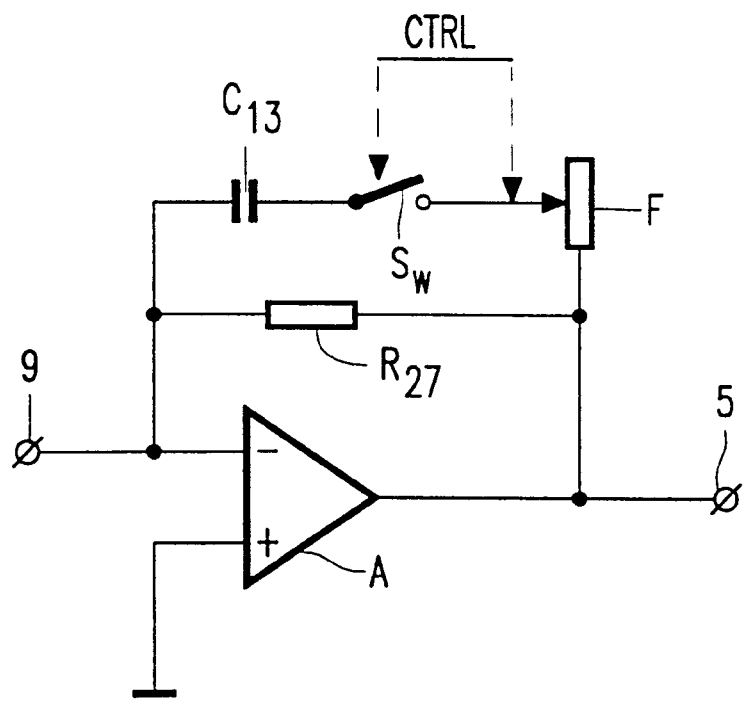
FIG. 3 shows an alternative embodiment of an amplifier arrangement in accordance with the present invention.

FIG. 3 shows the essential parts of an embodiment of this alternative. The display signal is applied to an inverting input (–) of the amplifier A. A non-inverting input (+) of the amplifier A is connected to ground. The amplifier A has a feedback network between the output 5 and the inverting input (–). The feedback network comprises the resistor R27. A series connection of a capacitor C13, a switch Sw, and a fader F, is connected in parallel with the resistor R27. Both the switch Sw and the fader F are controlled by the control signal CTRL which, as before, depends on the measured supply current of the amplifier A.

I claim:

1. A display signal amplifier arrangement comprising:
   an amplifier having a supply current terminal, a signal input and a signal output;
   a current-sensing circuit having a sensing input coupled to said supply current terminal of the amplifier, and a control output for supplying a control signal; and
   a bandwidth-reducing circuit for attenuating a high-frequency part of a display signal applied to said amplifier and/or for decreasing a high-frequency part of a transfer function of said amplifier, in response to said control signal.

2. A display apparatus for displaying a display signal, the apparatus comprising:
   a display signal amplifier arrangement as claimed in claim 1; and
   a display device coupled to said signal output of said amplifier.

3. A method of amplifying a display signal, the method comprising the steps:

amplifying said display signal by means of an amplifier to which a supply current is applied;

measuring said supply current to derive a control signal; and reducing a bandwidth of said display signal applied to a signal input of said amplifier, wherein a high-frequency part of said display signal is attenuated in response to said control signal.

4. A method of amplifying a display signal, the method comprising the steps:

amplifying said display signal by means of an amplifier to which a supply current is applied;

measuring said supply current to derive a control signal; and decreasing a high-frequency part of a transfer function of said amplifier in response to said control signal.

* * * * *